United States Patent
Liu et al.

(10) Patent No.: US 7,257,283 B1
(45) Date of Patent: Aug. 14, 2007

(54) TRANSMITTER-RECEIVER WITH INTEGRATED MODULATOR ARRAY AND HYBRID BONDED MULTI-WAVELENGTH LASER ARRAY

(75) Inventors: Ansheng Liu, Cupertino, CA (US); Mario J. Paniccia, Santa Clara, CA (US); Richard Jones, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/480,610

(22) Filed: Jun. 30, 2006

(51) Int. Cl.
*G02B 6/12* (2006.01)
*G02B 6/28* (2006.01)

(52) U.S. Cl. .......................... 385/14; 385/24

(58) Field of Classification Search .................. 385/14, 385/4, 3, 11, 15, 6, 24, 40, 45
See application file for complete search history.

(56) References Cited

U.S. PATENT DOCUMENTS 5,870,512 A * 2/1999 Koch et al. .................... 385/14
6,785,430 B2   8/2004 Paniccia
7,133,586 B2 * 11/2006 Yegnanarayanan et al. ... 385/14

OTHER PUBLICATIONS

Jacobsen, Rune S. et al., "Strained Silicon As a New Electro-Optic Material," *Nature Publishing Group*, NATURE, vol. 441, May 11, 2006, doi: 10/10938/nature 04706, pp. 199-202.
Bowers, J.E. et al., "Hybrid Silicon Evanescent Lasers," *Device Research Conference 2006 (DRC 2006)*, University Park, PA, Jun. 2006.
Fang, A.W. et al., "A Continuous-Wave Hybrid AlGaInAs-Silicon Evanescent Laser," *IEEE Photonics Technology Letters*, vol. 18, No. 10, pp. 1143-1145, May 2006.
Bowers, J.E. et al., "A Technology for Integrating Active Photonic Devices on SOI Wafers," *Indium Phosphide and Related Materials conference (IPRM 2006)*, Princeton, NJ, May 2006.
Park, H. et al., "An Optically Pumped Silicon Evanescent Laser Operating Continuous Wave at 60° C.," *Optical Fiber Communication Conference (OFC 2006)*, paper OWH2, Mar. 2006.
Fang. A.W. et al., "Heterogeneous Integration of Silicon and AlGaInAs for a Silicon Evanescent Laser," *Proc. of SPIE 6133, (Photonics West 2006)*, vol. 6133, 61330W, San Jose, CA, Jan. 2006.

(Continued)

*Primary Examiner*—Quyen Leung
(74) *Attorney, Agent, or Firm*—Blakely, Sokoloff, Taylor & Zafman LLP

(57) ABSTRACT

An apparatus and method providing a plurality of modulated optical beams from a single layer of semiconductor material. For one example, an apparatus includes a plurality of optical waveguides disposed in a single layer of semiconductor material. Each one of the plurality of optical waveguides includes an optical cavity defined along the optical waveguide. A single bar of gain medium material adjoining the single layer of semiconductor material across the plurality of optical waveguides is included. The gain medium-semiconductor material interface is defined along each of the plurality of optical waveguides. A plurality of optical modulators is disposed in the single layer of semiconductor material. Each one of the plurality of optical modulators is optically coupled to a respective one of the plurality of optical waveguides to modulate a respective optical beam directed from the optical cavity.

26 Claims, 5 Drawing Sheets

OTHER PUBLICATIONS

Park, H. et al., "Hybrid Silicon Evanescent Laser Fabricated With a Silicon Waveguide and III-V Offset Quantum Wells," *Opt. Express*, vol. 13, No. 23, pp. 9460-9464, Nov. 14, 2005.

Fang, A.W. et al., "An Optically Pumped Silicon Evanescent Laser," *The 31st European Conference on Optical Communications (ECOC 2005)*, SECC, Glasgow. Scotland, Sep. 2005.

Bowers, U.S. Appl. No. 60/760,629, filed Jan. 20, 2006.

Bowers, U.S. Appl. No. 60/795,064, filed Apr. 26, 2006.

Liu, U.S. Appl. No. 11/480,610, filed Jun. 30, 2006, instant application.

Bowers, U.S. Appl. No. 11/534,560, filed Sep. 22, 2006.

* cited by examiner

TRANSMITTER-RECEIVER WITH INTEGRATED MODULATOR ARRAY AND HYBRID BONDED MULTI-WAVELENGTH LASER ARRAY

BACKGROUND OF THE DISCLOSURE

1. Field of the Invention

The present invention relates generally to optics and, more specifically, the present invention relates to optical interconnects and communications.

2. Background Information

The need for fast and efficient optical-based technologies is increasing as Internet data traffic growth rate is overtaking voice traffic pushing the need for fiber optical communications. Transmission of multiple optical channels over the same fiber in the dense wavelength-division multiplexing (DWDM) systems and Gigabit (GB) Ethernet systems provide a simple way to use the unprecedented capacity (signal bandwidth) offered by fiber optics. Commonly used optical components in the system include wavelength division multiplexed (WDM) transmitters and receivers, optical filter such as diffraction gratings, thin-film filters, fiber Bragg gratings, arrayed-waveguide gratings, optical add/drop multiplexers and lasers.

Lasers are well known devices that emit light through stimulated emission, produce coherent light beams with a frequency spectrum ranging from infrared to ultraviolet, and may be used in a vast array of applications. For example, in optical communications or networking applications, semiconductor lasers may be used to produce light or optical beams on which data or other information may be encoded and transmitted.

Other devices used in optical communications or networking applications are fiber-based Bragg gratings. A fiber Bragg grating is an optical fiber with periodic changes in the refractive index of fiber core materials along the fiber length, which may be formed by exposure of the photosensitive core to an intense optical interference pattern. With the changes in the refractive index along the fiber length, optical beams at a particular wavelength are reflected by the fiber Bragg grating while other wavelengths are allowed to propagate through the fiber.

A limitation with fiber Bragg gratings is that the particular wavelength that is reflected by the fiber Bragg grating is substantially fixed. Consequently, if different wavelengths of light are to be reflected, different fiber Bragg gratings are utilized. In some known fiber Bragg gratings, nominal adjustments to the reflected wavelength may be provided by physically or mechanically stretching the optical fiber of the fiber Bragg grating to modify the length of the optical fiber. The disadvantage of this technique is that the amount of adjustment to the reflected wavelength is relatively small and the optical fiber may suffer damage from the physical stress and strain of the stretching.

Additional devices used in optical communications include optical transmitters which are key components in broadband DWDM networking systems and in Gigabit (GB) Ethernet systems. Currently, most optical transmitters are based on a number of fixed wavelength lasers combined with an external modulator or in some cases a directly modulated laser. After light produced from a laser is modulated, it is multiplexed with an external multiplexer and then sent to an optical fiber network where it may be amplified or directed by an optical switch, or both. Separate lasers and modulators are used for each transmission channel, since the lasers typically produce a fixed wavelength. The costs of producing lasers and associated components are very high, however, and using separate components for each wavelength of light to be transmitted can be expensive and inefficient.

BRIEF DESCRIPTION OF THE DRAWINGS

The present invention is illustrated by way of example and not limitation in the accompanying figures.

DETAILED DESCRIPTION

Methods and apparatuses for providing an ultra-high capacity transmitter-receiver with an integrated semiconductor modulator array and hybrid bonded multi-wavelength laser array are disclosed. In the following description numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments. In addition, it is appreciated that the figures provided herewith are for explanation purposes to persons ordinarily skilled in the art and that the drawings are not necessarily drawn to scale.

Figure 1:
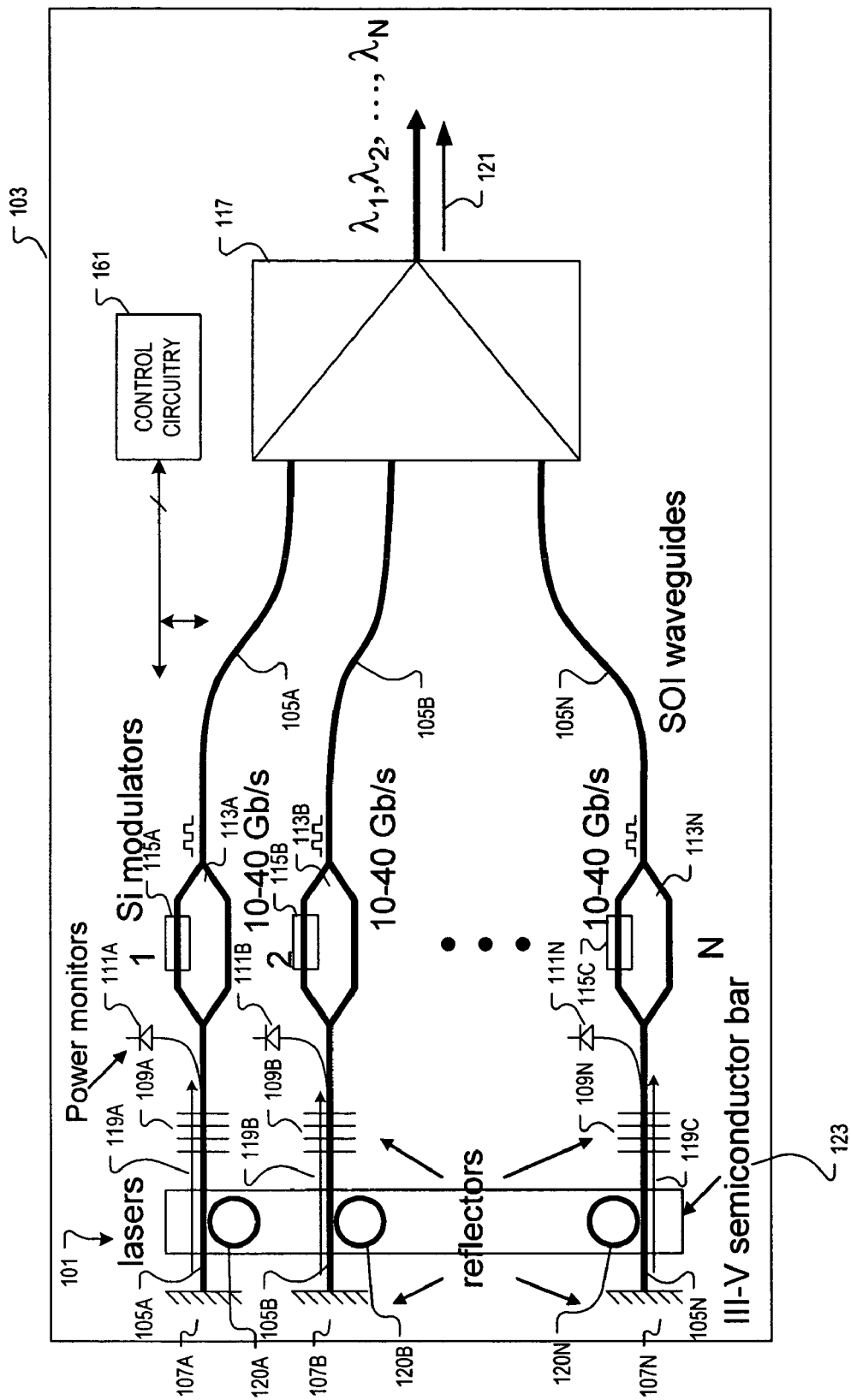
FIG. 1 is an illustration showing generally one example of an integrated semiconductor modulator multi-wavelength laser array in accordance with the teachings of the present invention.

To illustrate, FIG. 1 is an illustration showing generally one example of an integrated semiconductor modulator multi-wavelength laser array 101 in accordance with the teachings of the present invention. In the illustrated example, multi-wavelength laser array 101 provides a plurality of continuous-wave (CW) optical beams 119A, 119B . . . 119N from a single layer of semiconductor material 103. In one example, the single layer of semiconductor material 103 is the silicon layer of a silicon-on-insulator (SOI) wafer. In the depicted example, each of the optical beams 119A, 119B . . . 119N is a broadband laser output with the laser spectral width determined mainly by gain and cavity reflection spectral widths of the respective lasers. Example multi-wavelength laser array 101 includes a plurality of optical waveguides 105A, 105B . . . 105N disposed in the single layer of semiconductor material 103. In the illustrated example, "N" optical waveguides are shown in FIG. 1 to represent the plurality of optical waveguides. It is appreciated that the plurality of waveguides may represent two or more optical waveguides in accordance with the teachings of the present invention. Stated differently, N is greater than or equal to two in accordance with the teachings of the present invention. In one example, the optical waveguides are silicon rib waveguides, strip waveguides, or the like, disposed in the single layer of semiconductor material 103.

In one example, each one of the plurality of optical waveguides 105A, 105B . . . 105N includes an optical cavity defined along the optical waveguide between the respective reflectors 107A/109A, 107B/109B . . . 107N/109N in accordance with the teachings of the present invention. In various examples, the reflectors may include one or more of gratings in the semiconductor material 103, reflective coatings on facets of the semiconductor material 103, or other suitable techniques to define the optical cavities in the plurality of optical waveguides 105A, 105B . . . 105N in accordance with the teachings of the present invention. In another example, ring resonators 120A, 120B . . . 120N are defined in the semiconductor material 103 and are each optically coupled to a respective one of the plurality of optical waveguides 105A, 105B . . . 105N to define an optical cavity along the respective optical waveguide in accordance with the teachings of the present invention. In the example optical cavity that includes reflectors 107A/109A, 107B/109B . . . 107N/109N, the ring resonators 120A, 120B . . . 120N are not included. In the example optical cavity that includes the ring resonators 120A, 120B . . . 120N, the included reflectors 107A/109A, 107B/109B . . . 107N/109N are not included.

A single bar of gain medium material 123 is adjoining the single layer of semiconductor material 103 across the plurality of optical waveguides 105A, 105B. 105N. In another example, there may be more than one single bar of gain medium material 123 included in the multi-wavelength laser array 101. However, in such an example, each single bar of gain medium material 123 is disposed across a plurality of optical waveguides in accordance with the teachings of the present invention. In one example, the single bar of gain medium material 123 is III-V semiconductor bar including III-V semiconductor materials such as InP. In particular, the single bar of gain medium material 123 is for example a single multiple quantum well (MQW) based InP gain chip that is flip chip bonded or wafer bonded across the "tops" of the plurality of silicon rib waveguides in the silicon layer of an SOI wafer. As a result, an array of III-V lasers is formed with a gain medium-semiconductor material interface defined along each of the plurality of optical waveguides 105A, 105B . . . 105N. Since there are no alignment issues with bonding the single bar of gain medium material 123 bonded across the plurality of optical waveguides as shown, the array of lasers is provided and fabricated at a fraction of the cost of attaching and aligning discrete individual lasers, such as for example Vertical-Cavity Surface-Emitting Lasers (VCSELs) or the like, in accordance with the teachings of the present invention.

In one example, a plurality of power monitors 111A, 111B . . . 111N are optically coupled to optical waveguides 105A, 105B . . . 105N, respectively. In one example, the plurality of power monitors 111A, 111B . . . 111N may include one or more of integrated helium ion doped semiconductor waveguide photodetectors or suitable ion implanted semiconductor waveguide photodetectors, integrated SiGe photodetectors, or the like, disposed in single layer of semiconductor material 103 to monitor the plurality of optical beams 119A, 119B . . . 119N output from the respective lasers in accordance with the teachings of the present invention.

A plurality of optical modulators 113A, 113B . . . 113N is disposed in the single layer of semiconductor material 103. In one example of the plurality of optical modulators 113A, 113B . . . 113N are Si modulators as shown, each of which includes a Mach-Zehnder Interferometer (MZI) having two arms. In one example, the Si modulators can operate at speeds of 10-40 Gbs and beyond. At least one of the arm of each MZI in the optical modulators 113A, 113B . . . 113N include a respective optical phase shifter 115A, 115B . . . 115N to modulate a phase shift between each arm of each respective MZI to modulate an optical beam. Therefore, each one of the plurality of optical modulators 113A, 113B . . . 113N is optically coupled to a respective one of the plurality of optical waveguides to modulate the respective optical beam 119A, 119B . . . 119N directed from the optical cavity defined within the respective optical waveguide 105A, 105B . . . 105N.

In other examples, it is appreciated that the plurality of optical modulators 113A, 113B . . . 113N could be implemented using other suitable techniques in accordance with the teachings of the present invention. For instance, other optical modulators may be provided by using the same or similar wafer bonding mechanism as the detectors and lasers, by using electro-optic strained silicon, or by directly modulating the lasers, or by employing other suitable optical modulating techniques in accordance with the teachings of the present invention.

In the illustrated example, a multiplexer 117 is coupled to the plurality of optical modulators 115A, 115B . . . 115N to combine the modulated optical beams 119A, 119B . . . 119N into single optical beam 121 in accordance with the teachings of the present invention. In one example, the multiplexer 117 is an wavelength selective arrayed waveguide grating (AWG), which is used by multi-wavelength laser array 101 to select the desired wavelengths $\lambda_1, \lambda_2 \ldots \lambda_N$ from the modulated optical beams 119A, 119B and 119N and combine the selected wavelengths of modulated optical beams 119A, 119B and 119N into optical beam 121 in accordance with the teachings of the present invention. In one example, the multiplexer 117 as relatively small dimensions of for example approximately 1×1 mm, which will fit onto a single die including the single layer of semiconductor material 103 in accordance with the teachings of the present invention.

In example illustrated in FIG. 1, control circuitry 161 may also be included or integrated in the single layer of semiconductor material 103 in accordance with teachings of the present invention. For instance, in one example, the single layer of semiconductor material 103 is silicon and control circuit 161 may be integrated directly in the silicon. In one example, the control circuit 161 may be electrically coupled to control and/or monitor any one or more of the multi-wavelength laser array 101, the plurality of power monitors 111A, 111B . . . 111N, the plurality of optical modulators 113A, 113B . . . 113N or other devices or structures disposed in the single layer of semiconductor material 103 in accordance with teachings of the present invention.

Figure 2:
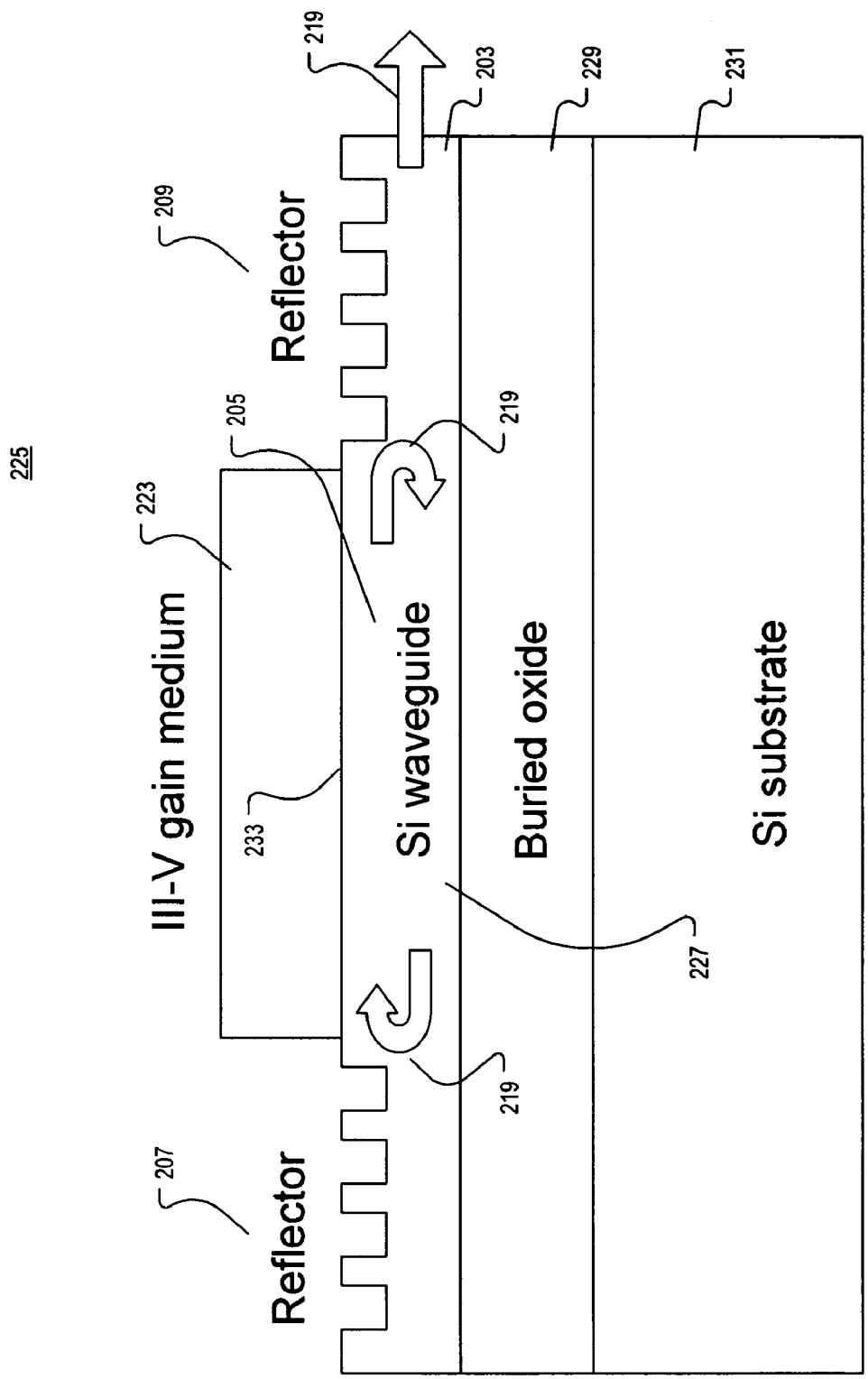
FIG. 2 is a side cross-section view showing generally one of the plurality of example lasers that may be employed in the integrated semiconductor modulator multi-wavelength laser array in accordance with the teachings of the present invention.

FIG. 2 is a side cross-section view showing generally an example laser, which may be one of the plurality of lasers illustrated in the integrated semiconductor modulator multi-wavelength laser array 101 of FIG. 1 in accordance with the teachings of the present invention. As shown in FIG. 2, laser 225 is integrated in an SOI wafer including a single semiconductor layer 203 with a buried oxide layer 229 disposed between the single semiconductor layer 203 and a substrate layer 231. In one example, the single semiconductor layer 203 and the substrate layer 231 are made of silicon. As shown, an optical waveguide 205 is disposed in the single semiconductor layer 203. In one example, optical waveguide 205 is a rib waveguide with an optical cavity 227 defined between reflectors 207 and 209. As shown in FIG. 2, reflectors 207 and 209 are Bragg reflectors in one example in accordance with the teachings of the present invention.

Similar to the single bar of gain medium material 123 of FIG. 1, a single bar of gain medium material 223 is bonded to "top" of the single layer of semiconductor material 203 as shown in FIG. 2 across the "top" of and adjoining optical waveguide 205. As a result, there is a gain medium-semiconductor material interface 233 along optical waveguide 205 parallel to the direction of propagation of an optical beam along optical waveguide 205. In one example, the single bar of gain medium material 223 is a III-V gain medium and there is an evanescent optical coupling between the optical waveguide 205 and the single bar of gain medium material 223. Depending on the waveguide dimensions of optical waveguide 205, a part of the optical mode inside the III-V gain medium and a part of the optical mode is inside the rib region of the optical waveguide 205. In an example with the MQW as a gain medium and with silicon waveguide based reflectors as mirrors, lasing is obtained with the optical cavity 227 in accordance with the teachings of the present invention. In FIG. 2, the lasing is shown with optical beam 219 reflected back and forth between reflectors 207 and 209 within optical cavity 227 with the III-V gain medium 223. In the illustrated example, reflector 209 is partially reflective such that optical beam 219 is output on the right side of FIG. 2 in accordance with the teachings of the present invention. In one example, laser 225 is a broadband laser and the reflectors 207 and 209 therefore do not need to be narrow band reflectors or Bragg gratings for the optical cavity 227, which largely reduces fabrication complexity in accordance with the present invention.

Figure 3:
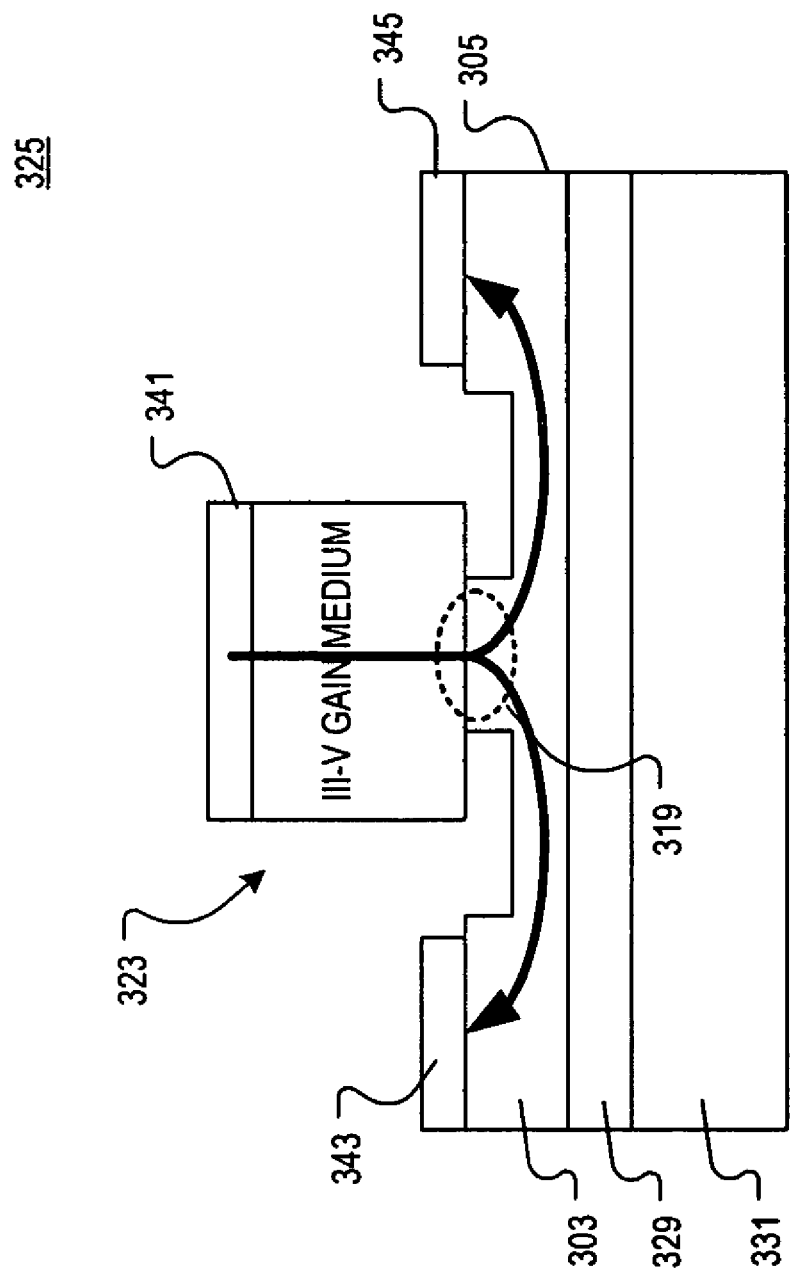
FIG. 3 is another cross-section view showing generally one of the plurality of example lasers that may be employed in the integrated semiconductor modulator multi-wavelength laser in accordance with the teachings of the present invention.

FIG. 3 is a cross-section view showing generally an example of a laser 325, which may be employed as one of the plurality of lasers illustrated and described above in connection with FIG. 1 or 2 in the integrated semiconductor modulator multi-wavelength laser in accordance with the teachings of the present invention. As shown, an SOI wafer is included having a buried oxide layer 329 disposed between a single layer of semiconductor material 303 and a semiconductor substrate 331. In the illustrated example, a silicon rib waveguide 305 is disposed in the single layer of semiconductor material 303.

Continuing with the example shown in FIG. 3, a single bar of gain medium material 323 is bonded on top of the optical waveguide 305. As shown in the example of FIG. 3, part of the optical mode 319 is shown to be inside the rib region of optical waveguide 305 and part of the optical mode 319 is inside single bar of gain medium material 323 depending on the dimensions of the optical waveguide 305 with the evanescent coupling between the single bar of gain medium material 323 and the optical waveguide 305. As shown in FIG. 3, one example of the single bar of gain medium material 323 includes a p-type doped III-V semiconductor material, such as for example InP or another suitable III-V material. In one example, the single bar of gain medium material 323 also includes a multiple quantum well (MQW) material. In one example, the single bar of gain medium material 323 is bonded to and adjoining the rib region of the optical waveguide 305 in accordance with the teachings of the present invention. As shown, a contact 341 is also coupled to the single bar of gain medium material 323.

In the example shown in FIG. 3, a conductive bond design is illustrated in which current injection is performed through the silicon of the optical waveguide 305 to operate and electrically pump laser 325 in accordance with the teachings of the present invention. As such, the silicon rib waveguide 305 includes n-type doping. In the illustrated example contacts 343 and 345 are coupled to the outer portions of the slab region of the optical waveguide 305. Accordingly, current is injected through the contact 341 through the single bar of gain medium material 323 through the n-type doped optical waveguide 305 to the contacts 343 and 345 to operate laser 325 in accordance with the teachings of the present invention.

Figure 4:
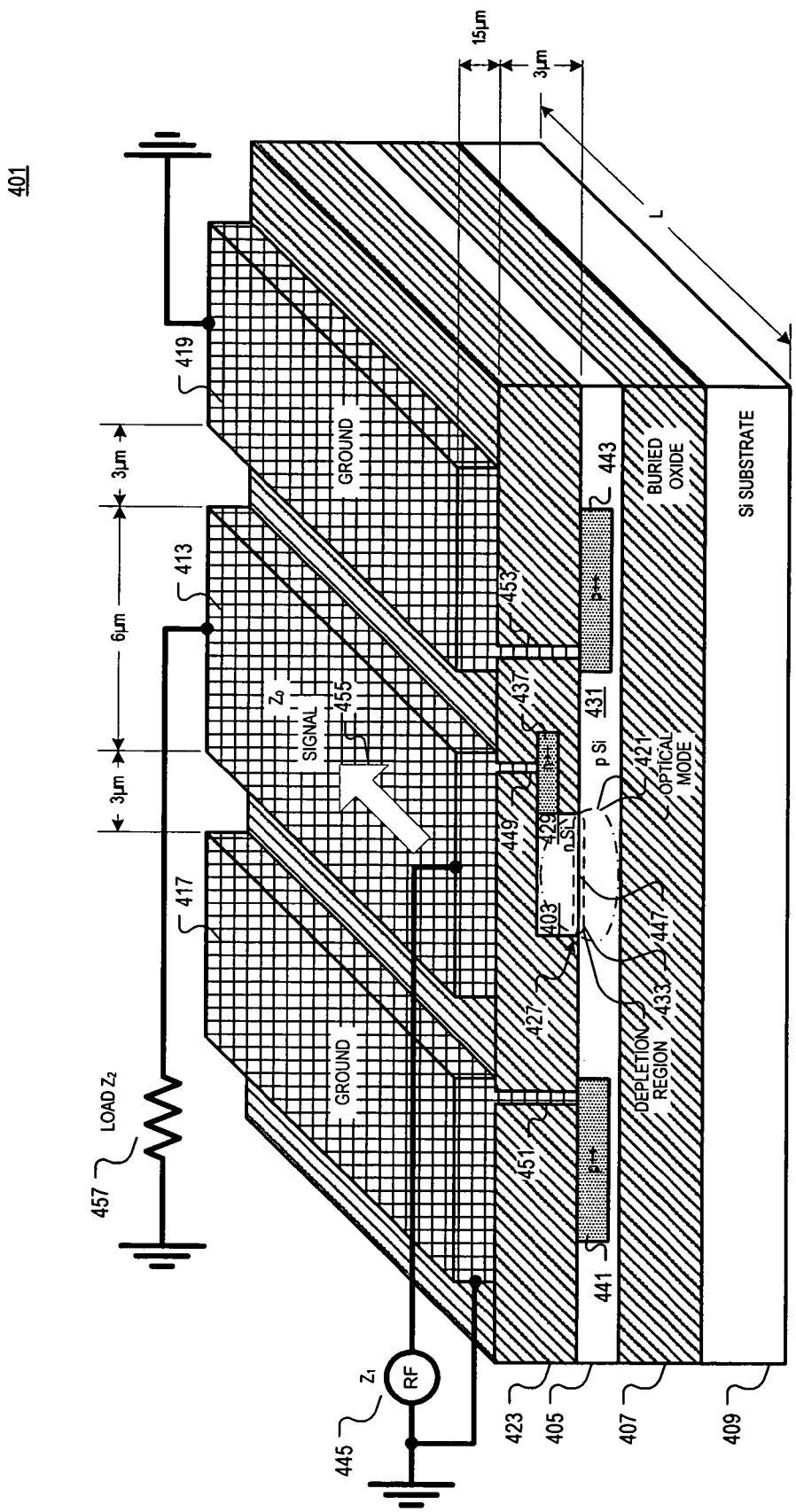
FIG. 4 is a cross-section illustration showing generally one example of an optical phase modulator including an optical waveguide with a single sided coplanar contact with a depletion region at a pn junction interface employed in an optical modulator in accordance with the teachings of the present invention.

FIG. 4 is a cross-section illustration showing generally one example of an optical phase modulator 401 including an optical waveguide 427 with a single sided coplanar contact 413 with a depletion region 433 at a pn junction interface 447 employed in an optical modulator in accordance with the teachings of the present invention. In one example, optical phase modulator 401 may be used in place with one or more of the optical phase modulators 115A, 115B . . . 115N of optical modulators 113A, 113B . . . . 113N of FIG. 1, in accordance with the teachings of the present invention.

In the illustrated example of FIG. 4, the depletion region 433 at the pn junction interface 447 is illustrated at a time when there is a substantially zero external drive voltage in traveling signal 455 applied by radio frequency (RF) source 445 in accordance with the teachings of the present invention. For one example, there are substantially no free charge carriers in depletion region 433, while there are free charge carriers outside of depletion region 433 due to the n-type and p-type doping. As shown in the illustrated example, optical phase modulator 401 includes an optical waveguide 427 including adjoining regions 403 and 405 of semiconductor material having opposite doping types. In the illustrated example, optical waveguide 427 is shown as a rib waveguide including a rib region 429 and a slab region 431. As can be seen in the illustrated example, the intensity of a propagating optical mode 421 of an optical beam through optical waveguide 427 is vanishingly small at the "upper corners" of rib region 429 as well as the "sides" of the slab region 431 of optical waveguide 427. In the illustrated example, the optical beam is shown propagating "into the page" through optical waveguide 427. In other examples, it is appreciated that other types of suitable waveguides may be employed such as strip waveguides or the like. In one example, the semiconductor material includes silicon (Si). For example, region 403 may include n type silicon and region 405 may include p type silicon such that the free charge carriers in the n type silicon outside of depletion region 433 are electrons and the free charge carriers in the p type silicon outside of depletion region 433 are holes. In other examples, the semiconductor material may include other suitable types of semiconductor material such as for example germanium (Ge), Si/Ge, or the like. In one example, regions 403 and 405 in one example have doping concentrations such that the pn junction interface 447 between regions 403 and 405 is reverse biased due to the built-in electrical field. In another example, the polarities of the dopings of regions 403 and 405 may be reversed in accordance with the teachings of the present invention.

The example in FIG. 4 also shows that the optical phase modulator 401 is included in an SOI wafer, and therefore includes a buried oxide layer 407 disposed between another semiconductor layer 409 and the semiconductor material of region 405. As shown, optical phase modulator 401 also includes a buffer layer insulating material 423 which also serves as cladding material for the optical waveguide 427. In the illustrated example, optical phase modulator 401 further includes higher doped regions 437, 441 and 443, which are disposed outside the optical path of the optical mode 421 through optical waveguide 427. With higher doped regions 437, 441 and 443 disposed outside the optical path of the optical mode 423 through optical waveguide 421, optical loss is reduced. In the illustrated example, higher doped region 437 is n++doped, which is the same type of doping type as region 403 and higher doped regions 441 are p++doped, which is the same doping type (p) as region 405. In the illustrated example, higher doped regions 437, 441 and 443 have higher doping concentrations than the doping concentrations of regions 403 and 405 within the optical path of the optical mode 421 along optical waveguide 427.

As shown, higher doped regions 441 and 443 are symmetrically adjoining and coupled to respective opposite lateral sides of region 405. In contrast, higher doped region is asymmetrically adjoining and coupled to only one of the two opposite lateral sides of region 403, in accordance with the teachings of the present invention. Optical phase modulator also includes coplanar contacts 413, 417 and 419, which are coupled to higher doped regions 437, 441 and 443, respectively, through the buffer layer insulating material 423 through vias 449, 451 and 453, respectively. As shown, coplanar contacts 413, 417 and 419 are also located outside the optical path of the optical mode 421 through optical waveguide 427. For one example, coplanar contacts 413, 417 and 419 include metal with high electrical conductivity and low resistance. In the illustrated example, coplanar contacts 413, 417 and 419 are combined and connected with a metal electrode designed for high frequency traveling wave signal transmission in accordance with the teachings of the present invention.

As shown the illustrated example, one end of coplanar contact 413 is coupled to receive the traveling wave signal 455 from RF source 445. The other end of coplanar contact 413 is terminated with a load impedance or termination load 457 coupled to a reference voltage such as ground. In addition, coplanar contacts 417 and 419 are coupled to the reference voltage such as ground. Thus, the bias of the pn junction interface 447 between regions 403 and 405 is adjusted with the application of the external drive voltage through traveling wave signal 455 through higher doped regions 437, 441 and 443 in accordance with the teachings of the present invention. The higher doping concentrations higher doped regions 437, 441 and 443 help improve the electrical coupling of coplanar contacts 413, 417 and 419 to semiconductor material regions 403 and 405 in accordance with the teachings of the present invention. This improved electrical coupling reduces the contact resistance between metal contacts 413, 417 and 419 and semiconductor material regions 403 and 405, which reduces the RF attenuation of the traveling wave signal 455, which improves the electrical performance of optical phase modulator 401 in accordance with the teachings of the present invention. The reduced RF attenuation and good optical electrical wave velocity matching enable faster switching times and device speed for optical phase modulator 401 in accordance with the teachings of the present invention.

In the illustrate example, the traveling wave signal 455 is applied to one end of coplanar contact 413 by RF source 445 to adjust the size or thickness of depletion region 433 at the pn junction interface 447 between regions 403 and 405 of optical waveguide 427 in accordance with the teachings of the present invention. As shown, the depletion region 433 overlaps with the optical mode 421 of the optical beam propagating through the optical waveguide 427. In the example device shown in FIG. 4, both the optical wave and RF microwaves co-propagate along the waveguide. When the RF phase velocity matches the optical group velocity, the optical beam experiences phase shift responding to the applied electrical field. The device speed is therefore not limited by the RC time constant in accordance with the teachings of the present invention.

For one example, the respective widths, heights, and relative positions to the higher doped regions 437, 441 and 443 coupled to coplanar contacts 413, 417 and 419 are designed to obtain the velocity matching. For example, RF phase velocity is generally determined by the device inductance and capacitance. By varying the metal contact geometry and semiconductor as well as dielectric layer thickness, the inductance and capacitance values can be changed, and in turn, the RF phase velocity can be matched with optical group velocity. This is called "real" phase velocity matching. In another example the phase velocities may be "artificially" matched by, for example, utilizing a phase reversed electrode design. In addition, doping distribution and metal electrode may be designed to obtain a small RF attenuation. For instance, less than 6 dB is needed for the benefit using traveling wave drive scheme in accordance with the teachings of the present invention.

For one example, when there is no external drive voltage or when the external drive voltage from traveling wave signal 455 is substantially zero, the depletion region 433 at the pn junction interface 447 between regions 403 and 405 of optical waveguide 427 is a result of the built-in electrical field caused by the doping concentrations of regions 403 and 405. However, when a non-zero external drive voltage is applied via traveling wave signal 455, the reverse bias at the pn junction interface 447 between regions 403 and 405 of optical waveguide 427 is increased, which results in the corresponding depletion region 433 being substantially larger or thicker in accordance with the teachings of the present invention. As a result of the larger or thicker depletion region 433, a greater cross-sectional area of the mode of optical beam 421 propagating along the optical path through optical waveguide 427 overlaps with and propagates through a depletion region with substantially no free charge carriers By modulating depletion region 433 at the pn junction interface 447 between regions 403 and 405 of optical waveguide 427 in response drive signal 445 as shown, the overall concentration of free charge carriers along the optical path of optical waveguide 427 through which the optical beam 421 is directed is modulated in response to the external drive voltage applied via the traveling wave signal 455 by modulating the size of the depletion region 433 in accordance with the teachings of the present invention. Thus, the phase of the optical beam 421 propagating along the optical path through optical waveguide 427 is therefore modulated in response to traveling wave signal 455 in accordance with the teachings of the present invention.

In operation, the optical beam is directed through optical waveguide 427 along an optical path through depletion region 433. Traveling wave signal 455 is applied to optical waveguide 427 through coplanar contact 413 to modulate or adjust the thickness of depletion region 433, which modulates the presence or absence of free charge carriers along the optical path through optical waveguide 127. Stated differently, the overall free charge carrier concentration along the optical path of optical waveguide 427 is modulated in response to the traveling wave signal 455 applied to optical waveguide 427 through coplanar contact 413. The free charge carriers present or absent along the optical path through which the optical beam is directed through optical waveguide 427 may include for example electrons, holes or a combination thereof. The presence of free charge carriers may attenuate optical beam when passing through. In particular, the free charge carriers along the optical path of optical waveguide 427 may attenuate optical beam by converting some of the energy of optical beam into free charge carrier energy. Accordingly, the absence or presence of free charge carriers in the depletion region 433 in response to traveling wave signal 455 will modulate optical beam in accordance with the teachings of the present invention.

In the illustrated example, the phase of optical beam passing through free charge carriers or the absence of free charge carriers in optical waveguide 427 is modulated due to the plasma dispersion effect. The plasma dispersion effect arises due to an interaction between the optical electric field vector and free charge carriers that may be present along the optical path of the optical beam in optical waveguide 427. The electric field of the optical beam polarizes the free charge carriers and this effectively perturbs the local dielectric constant of the medium. This in turn leads to a perturbation of the propagation velocity of the optical wave and hence the index of refraction for the light, since the index of refraction is simply the ratio of the speed of the light in vacuum to that in the medium. Therefore, the index of refraction in optical waveguide 427 of optical device 401 is modulated in response to the modulation of free charge carriers. The modulated index of refraction in the optical waveguide 427 of optical device 401 correspondingly modulates the phase of optical beam propagating through optical waveguide 427 of optical phase modulator 401. In addition, the free charge carriers are accelerated by the field and lead to absorption of the optical field as optical energy is used up. Generally the refractive index perturbation is a complex number with the real part being that part which causes the velocity change and the imaginary part being related to the free charge carrier absorption. The amount of phase shift $\phi$ is given by $$\phi = (2\pi/\lambda)\Delta nL \quad \text{(Equation 1)}$$

with the optical wavelength $\lambda$, the refractive index change $\Delta n$ and the interaction length L. In the case of the plasma dispersion effect in silicon, the refractive index change $\Delta n$ due to the electron ($\Delta N_e$) and hole ($\Delta N_h$) concentration change is given by:

$$\Delta n = -\frac{e^2\lambda^2}{8\pi^2 c^2 \varepsilon_0 n_0}\left(\frac{b_e(\Delta N_e)^{1.05}}{m_e^*} + \frac{b_h(\Delta N_h)^{0.8}}{m_h^*}\right) \quad \text{(Equation 2)}$$

where $n_o$ is the refractive index of intrinsic silicon, e is the electronic charge, c is the speed of light, $\varepsilon_o$ is the permittivity of free space, $m_e^*$ and $m_h^*$ are the electron and hole effective masses, respectively, $b_e$ and $b_h$ are fitting parameters. The optical absorption coefficient change $\Delta_\alpha$ due to free charge carriers in silicon are given by $$\Delta\alpha = \frac{e^3\lambda^2}{4\pi^2 c^3 \varepsilon_0 n_0}\left[\frac{\Delta N_e}{m_e^{*2}\mu_e} + \frac{\Delta N_h}{m_h^{*2}\mu_h}\right] \quad \text{(Equation 3)}$$

where $\mu_e$ is the electron mobility and $\mu_h$ is the hole mobility.

In one example, the size of optical waveguide 427 is relatively small with dimensions such as 0.5 μm×0.5 μm to enable better optical phase modulation efficiency. As summarized above, higher doped region 437 is asymmetrically adjoining and coupled to region 403 as only one of the two lateral sides of region 403 is coupled to a higher doped region. In contrast, both lateral sides of region 405 are adjoining and coupled to higher doped regions 441 and 443. Because of this single sided contact to region 403 has a much lower capacitance than a symmetric double sided contact and also helps to achieve the required phase matching between electrical and optical signals, smaller RF attenuation, and larger (closer to 25 or 50 Ohms in one example) characteristic impedance for better driver-transmission line power coupling in accordance with the teachings of the present invention.

The traveling wave driving scheme employed in accordance with the teachings of the present invention helps to overcome RC time constant capacitance limits of optical device 101 to realize faster modulation speeds of 40 GHz and beyond with rise/fall times of approximately 5 ps or less of the reverse biased pn junction modulator. With the traveling-wave driving scheme employed by optical phase modulator, both optical and microwave signals co-propagate along the waveguide 427. If optical group velocity matches the RF phase velocity, RF attenuation will determine the true speed of optical phase modulator 401 instead of the RC time constant of optical device 401. Because the RF characteristics of a traveling wave electrode such as coplanar contact 413 strongly depends on both the pn junction and metal pattern, careful device design is employed in accordance with the teachings of the present invention. In addition, the impedance of the traveling-wave electrode, coplanar contact 413, is optimized in one example to match the RF driver impedance of RF source 445 for better microwave power coupling in accordance with the teachings of the present invention.

As shown in the depicted example, coplanar contact 413 functions as a traveling wave electrode for optical phase modulator with a transmission line impedance of $Z_0$. RF source 445 has a load impedance of $Z_1$ and termination load 457 has a load impedance of $Z_2$. In one example, the load impedance of $Z_1$ is approximately 25-50 Ohms in accordance with the teachings of the present invention. Coplanar contact 413 is a combined coplanar waveguide and microstrip because of the reverse biased pn junction interface 447. As illustrated, coplanar contact 413 is disposed between coplanar contacts 417 and 419 on top of pn junction interface 447 and optical waveguide 427 with a via 449 coupled to the n++ higher doped region 437 to deliver traveling wave signal 455 to optical waveguide 427. Coplanar contacts 417 and 419 function as two side metal plates for grounding. In one example, coplanar contact 413 is approximately 6 μm wide. The gap between coplanar contact 413 and the side coplanar contacts 417 and 419 is approximately 3 µm. The thickness of coplanar contacts 413, 417 and 419 is approximately 1.5 µm. The height of the vias 449, 451 and 453 through the insulating material 123 is approximately 3 µm.

Figure 5:
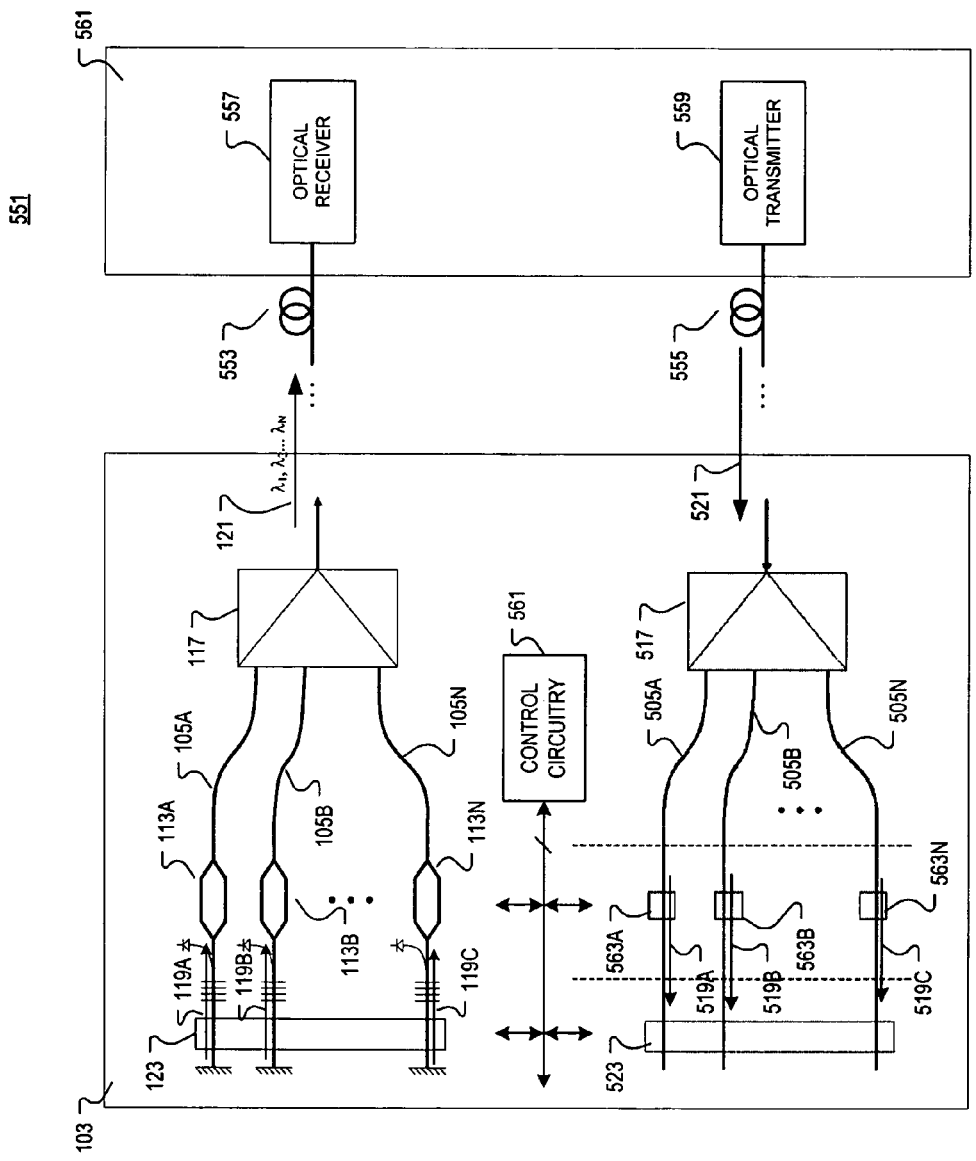
FIG. 5 is a diagram illustrating generally an example system including an ultra-high capacity transmitter-receiver with integrated semiconductor modulators and hybrid bonded multi-wavelength lasers in accordance with the teachings of the present invention.

FIG. 5 is an illustration of an example optical system 551 including an integrated semiconductor modulator multi-wavelength laser. It is appreciated that the one example of the integrated semiconductor modulator multi-wavelength laser array illustrated in FIG. 5 is similar to the integrated semiconductor modulator multi-wavelength laser illustrated previously in FIG. 1. For instance, the single semiconductor layer 103 as illustrated in FIG. 5 is an optical chip that includes a plurality of optical waveguides 105A, 105B . . . 105N over which a single bar of gain medium material 123 is bonded to create an array of broadband lasers generating a plurality of optical beams 119A, 119B . . . 119N in plurality of optical waveguides 105A, 115B . . . 105N, respectively. The plurality of optical beams 119A, 119B . . . 119N are modulated and then selected wavelengths of the plurality of optical beams 119A, 119B . . . 119N are then combined in with multiplexer 117 to output a single optical beam 121, which may be transmitted through a single optical fiber 553 to an external optical receiver 557 in accordance with the teachings of the present invention. In one example, the integrated semiconductor modulator multi-wavelength laser is capable of transmitting data at the multiple wavelengths included in the single optical beam 121 over the single optical fiber 553 at speeds of more than 1 Tb/s in accordance with the teachings of the present invention. For instance, in example in which the optical modulators 113A, 113B . . . 113N included in the integrated semiconductor modulator multi-wavelength laser operate at 40 Gb/s, the total capacity of the integrated semiconductor modulator multi-wavelength laser would be N×40 Gb/s, wherein N is the total number of the waveguide based laser sources. In one example, the plurality of optical waveguides 105A, 105B . . . 105N are spaced approximately 50-100 µm apart in the single layer of semiconductor material 103. Accordingly, in one example, an entire bus of optical data is maybe transmitted from the integrated semiconductor modulator multi-wavelength laser with less than a 4 mm piece of semiconductor material 103 in accordance with the teachings of the present invention.

FIG. 5 also shows that in example of optical system 551, the single semiconductor layer 103 may also be coupled to receive an optical beam 521 from an external optical transmitter 559 through a single optical fiber 555 in accordance with the teachings of the present invention. Therefore, in one illustrated example, the single semiconductor layer 103 is an ultra-high capacity transmitter-receiver within a small form factor in accordance with the teachings of the present invention. In the illustrated example, it is noted that external optical receiver 557 and external optical transmitter 559 are illustrated as existing on the same chip 561. In another example, it is appreciated that external optical receiver 557 and external optical transmitter 559 may exist on separate chips. In the illustrated example, the received optical beam 521 is received by a demultiplexer 517, which splits the received optical beam 521 into a plurality of optical beams 519A, 519B . . . 519N. In one example, the plurality of optical beams 519A, 519B . . . 519N are split according to their respective wavelengths by the demultiplexer 517 and are then directed through a plurality of optical waveguides 505A, 505B . . . 505N disposed in the single layer of semiconductor material.

As shown in the illustrated example, one or more optical detectors are optically coupled to each of the plurality of optical waveguides 505A, 505B . . . 505N to detect the respective plurality of optical beams 519A, 519B . . . 519N. In particular, in one example, an array of photodetectors 563A, 563B . . . 563N is optically coupled to the plurality of optical waveguides 505A, 505B . . . 505N. In one example, the array of photodetectors 563A, 563B . . . 563N includes SiGe photodetectors or the like to detect the plurality of optical beams 519A, 519B . . . 519N.

As shown in the depicted example, another single bar of semiconductor material 523 may be bonded to the single layer of semiconductor material 103 across the plurality of optical waveguides 505A, 505B . . . 505N to form an array of photodetectors optically coupled to the plurality of optical waveguides 505A, 505B . . . 505N. In one example, the single bar of semiconductor material 523 includes III-V semiconductor material to create III-V photodetectors optically coupled to the plurality of optical waveguides 505A, 505B . . . 505N. In one example, the single bar of semiconductor material 523 may be bonded to the single layer of semiconductor material 103 using similar techniques and technology as used to bond the single bar of semiconductor material 123 across the plurality of waveguides 105A, 105B . . . 105N in accordance with the teachings of the present invention. With SiGe and III-V based photodetectors optically coupled to the plurality of optical waveguides 505A, 505B . . . 505N as shown, a variety of wavelengths for the plurality of optical beams 519A, 519B . . . 519N may be detected in accordance with the teachings of the present invention.

In example illustrated in FIG. 5, control circuitry 561 may also be included or integrated in the single layer of semiconductor material 103 in accordance with teachings of the present invention. For instance, in one example, the single layer of semiconductor material 103 is silicon and control circuit 561 may be integrated directly in the silicon. In one example, the control circuit 561 may be electrically coupled to control and/or monitor any one or more of the multi-wavelength laser array, the plurality of power monitors, the plurality of optical modulators, the arrays of photodetectors or other devices or structures disposed in the single layer of semiconductor material 103 in accordance with teachings of the present invention.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. An apparatus, comprising:
a plurality of optical waveguides disposed in a single layer of semiconductor material, wherein each one of the plurality of optical waveguides includes an optical cavity defined along the optical waveguide;
a single bar of gain medium material adjoining the single layer of semiconductor material across the plurality of optical waveguides defining a gain medium-semiconductor material interface along each of the plurality of optical waveguides; and
a plurality of optical modulators disposed in the single layer of semiconductor material, each one of the plurality of optical modulators optically coupled to a respective one of the plurality of optical waveguides to modulate a respective optical beam directed from the optical cavity.

2. The apparatus of claim 1 further comprising multiplexer disposed in the single layer of semiconductor material, the multiplexer optically coupled to the plurality of optical modulators to combine optical beams received from each respective one of the plurality of optical modulators.

3. The apparatus of claim 2 wherein the multiplexer includes a wavelength selective arrayed waveguide grating (AWG) such that optical beams received from each respective one of the plurality of optical modulators is a broadband laser output and the output of the wavelength selective AWG is includes the selected wavelengths from the modulated plurality of optical beams.

4. The apparatus of claim 1 further comprising a plurality of power monitors disposed in the single layer of semiconductor material, each one of the plurality of optical power monitors optically coupled to a respective one of the plurality of optical waveguides to monitor the respective optical beam directed from the optical cavity.

5. The apparatus of claim 4 wherein the plurality of power monitors comprise one or more of helium ion implanted semiconductor waveguides, ion implanted waveguides or SeGe photodetectors disposed in the single layer of semiconductor material.

6. The apparatus of claim 1 wherein the single layer of semiconductor material comprises silicon layer of a silicon-on-insulator wafer and the single bar of gain medium material comprises a single bar of III-V semiconductor material multiple quantum well gain chip bonded to the single layer of semiconductor material and evanescently coupled to each of the plurality of optical waveguides.

7. The apparatus of claim 1 further comprising:
a demultiplexer disposed in the single layer of semiconductor material;
a second plurality of optical waveguides disposed in the single layer of semiconductor material and optically coupled to the demultiplexer; and
a first plurality of optical detectors optically coupled to the second plurality of optical waveguides to receive optical beams received by the second plurality of optical waveguides.

8. The apparatus of claim 7 wherein the single layer of semiconductor material comprises silicon and wherein the first plurality of optical detectors comprise a second single bar of III-V semiconductor material adjoining the single layer of semiconductor material across the second plurality of optical waveguides defining a III-V semiconductor-silicon interface along each of the second plurality of optical waveguides.

9. The apparatus of claim 7 further comprising a second plurality of optical detectors optically disposed in the single layer of semiconductor material, the second plurality optically coupled to the second plurality of optical waveguides to receive the optical beams received by the second plurality of optical waveguides.

10. The apparatus of claim 9 wherein the first plurality of optical detectors comprise III-V photodetectors and the second plurality of optical detectors comprise SiGe photodetectors.

11. The apparatus of claim 1 wherein the optical cavity is defined in the optical waveguide between reflectors disposed in the single layer of semiconductor material.

12. The apparatus of claim 1 wherein the optical cavity comprises a ring resonator optically coupled to the optical waveguide in the single layer of semiconductor material.

13. The apparatus of claim 1 further comprising control circuitry disposed in single layer of semiconductor material coupled to the plurality of optical modulators.

14. A method, comprising:
lasing a first optical beam in a first optical cavity defined along a first optical waveguide disposed in a single layer of semiconductor material;
lasing second optical beam within a second optical cavity defined along a second optical waveguide disposed in the single layer of semiconductor material, wherein the first and second optical waveguides are included in a plurality of optical waveguides disposed in the single layer of semiconductor material, wherein a single bar of gain medium material is adjoining the single layer of semiconductor material across the plurality of optical waveguides defining a gain medium-semiconductor material interface along each of the plurality of optical waveguides; and
modulating the first and second optical beams with respective first and second optical modulators disposed in the single layer of semiconductor material optically coupled to the first and second optical waveguides.

15. The method of claim 14 further comprising combining selected wavelengths of the modulated first and second optical beams received from the first and second optical modulators with a multiplexer disposed in the single layer of semiconductor material.

16. The method of claim 14 further comprising monitoring each of the first and second optical beams with respective first and second optical power monitors disposed in the single layer of semiconductor material.

17. The method of claim 14 wherein lasing the first and second optical beams comprises injecting current through at least one of the single layer of semiconductor material or the single bar of gain medium material.

18. The method of claim 14 further comprising:
receiving an optical beam with a demultiplexer disposed in the single layer of semiconductor material;
separating the optical beam received by the demultiplexer into a plurality of received optical beams, wherein each of the plurality of received optical beams has a different wavelength; and
detecting each of the plurality of received optical beams having the different wavelength with a respective one or more optical photodetectors disposed in the single layer of semiconductor material.

19. An optical system, comprising:
an optical chip including an array of optical lasers, the optical chip including:
a plurality of optical waveguides disposed in a single layer of semiconductor material, wherein each one of the plurality of optical waveguides includes an optical cavity defined along the optical waveguide;
a single bar of gain medium material adjoining the single layer of semiconductor material across the plurality of optical waveguides defining a gain medium-semiconductor material interface along each of the plurality of optical waveguides;
a plurality of optical modulators disposed in the single layer of semiconductor material, each one of the plurality of optical modulators optically coupled to a respective one of the plurality of optical waveguides to modulate a respective optical beam directed from the optical cavity defined within the respective optical waveguide;
a multiplexer disposed in the single layer of semiconductor material, the multiplexer optically coupled to the plurality of optical modulators to combine selected wavelengths of optical beams received from each respective one of the plurality of optical modulators;

an external optical receiver optically coupled to the receive the combined optical beams from the multiplexer; and an optical fiber optically coupled between the external optical receiver and an output of the multiplexer.

20. The optical system of claim 19 wherein the optical chip further comprises a plurality of power monitors disposed in the single layer of semiconductor material, each one of the plurality of optical power monitors optically coupled to a respective one of the plurality of optical waveguides to monitor the respective optical beam directed from the optical cavity.

21. The optical system of claim 20 wherein the plurality of power monitors comprise one or more of helium ion implanted semiconductor waveguides, ion implanted waveguides or SeGe photodetectors disposed in the single layer of semiconductor material.

22. The optical system of claim 19 wherein the single layer of semiconductor material in the optical chip comprises silicon layer of a silicon-on-insulator wafer and the single bar of gain medium material comprises a single bar of III-V semiconductor material multiple quantum well gain chip bonded to the single layer of semiconductor material and evanescently coupled to each of the plurality of optical waveguides.

23. The optical system of claim 19 wherein the optical chip further comprises:

a demultiplexer disposed in the single layer of semiconductor material optically coupled to receive an optical beam from an external optical transmitter and separate the received optical beam into a plurality of received optical beams wherein each of the received optical beams has a different wavelength;

a second plurality of optical waveguides disposed in the single layer of semiconductor material and optically coupled to the demultiplexer; and a first plurality of optical detectors optically coupled to the second plurality of optical waveguides to detect the received optical beams.

24. The optical system of claim 23 wherein the single layer of semiconductor material in the optical chip comprises silicon and wherein the first plurality of optical detectors comprise a second single bar of III-V semiconductor material adjoining the single layer of semiconductor material across the second plurality of optical waveguides defining a III-V semiconductor-silicon interface along each of the second plurality of optical waveguides.

25. The optical system of claim 24 wherein the optical chip further comprises a second plurality of optical detectors optically disposed in the single layer of semiconductor material, the second plurality of optical detectors optically coupled to the second plurality of optical waveguides to receive the received optical beams.

26. The optical system of claim 19 further comprising control circuitry disposed in single layer of semiconductor material coupled to one or more of array of lasers or the plurality of optical modulators.

* * * * *

UNITED STATES PATENT AND TRADEMARK OFFICE
CERTIFICATE OF CORRECTION

PATENT NO. : 7,257,283 B1
APPLICATION NO. : 11/480610
DATED : August 14, 2007
INVENTOR(S) : Liu et al.

It is certified that error appears in the above-identified patent and that said Letters Patent is hereby corrected as shown below:

In column 11, at line 18, delete "115B" and insert --105B--.

Signed and Sealed this

Fifteenth Day of April, 2008

JON W. DUDAS
*Director of the United States Patent and Trademark Office*